US006669783B2

(12) United States Patent
Sexton et al.

(10) Patent No.: US 6,669,783 B2
(45) Date of Patent: *Dec. 30, 2003

(54) HIGH TEMPERATURE ELECTROSTATIC CHUCK

(75) Inventors: Greg Sexton, Fremont, CA (US); Alan Schoepp, Ben Lomond, CA (US); Mark Allen Kennard, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 09/892,458

(22) Filed: Jun. 28, 2001

(65) Prior Publication Data

US 2003/0003749 A1 Jan. 2, 2003

(51) Int. Cl.[7] .................... H01L 21/306; C23C 16/00
(52) U.S. Cl. ................. 118/728; 361/234; 156/345.51; 156/345.52; 118/725
(58) Field of Search ............. 361/234; 156/345.53; 118/728, 725; H01L 21/306; C23C 16/00

(56) References Cited

U.S. PATENT DOCUMENTS

| 4,340,462 A | 7/1982 | Koch |
| 4,534,816 A | 8/1985 | Chen et al. |
| 4,579,618 A | 4/1986 | Celestino et al. |
| 4,615,755 A | 10/1986 | Tracy et al. |
| 4,665,463 A | 5/1987 | Ward et al. |
| 4,692,836 A | 9/1987 | Suzuki |
| 4,948,458 A | 8/1990 | Ogle |
| 5,055,964 A | 10/1991 | Logan et al. |
| 5,155,652 A | 10/1992 | Logan et al. |
| 5,160,152 A | 11/1992 | Toraguchi et al. |
| 5,200,232 A | 4/1993 | Tappan et al. |
| 5,221,404 A | 6/1993 | Oya et al. |
| 5,238,499 A | 8/1993 | van de Ven et al. |
| 5,262,029 A | 11/1993 | Erskine et al. |
| 5,350,479 A | 9/1994 | Collins et al. |
| 5,534,816 A | 7/1996 | Koglin et al. |
| 5,671,116 A | 9/1997 | Husain |
| 5,673,167 A | 9/1997 | Davenport et al. |
| 5,730,803 A | 3/1998 | Steger et al. |
| 5,796,066 A | 8/1998 | Guyot |

(List continued on next page.)

FOREIGN PATENT DOCUMENTS

| EP | 0628644 A2 | 12/1994 |
| EP | 1111661 A2 | 6/2001 |
| WO | WO 99/36956 | 7/1999 |

OTHER PUBLICATIONS

Notification of Transmittal of the International Search Report or the Declaration dated Mar. 13, 2003 for PCT/US02/17663.

*Primary Examiner*—Gregory Mills
*Assistant Examiner*—Ram N Kackar
(74) *Attorney, Agent, or Firm*—Burns, Doane, Swecker & Mathis, LLP

(57) ABSTRACT

An electrostatic chuck suitable for use at high temperatures having a replaceable expansion assembly, functioning as an outer tubulation and heat choke, between a chuck body and a heat transfer body. The expansion assembly accommodates differential thermal stresses between the chuck body and the heat transfer body, and/or limits direct heat conduction from the chuck body to the heat transfer body. The ability to operate the chuck at temperatures in excess of 200° C. allows it to be used for plasma etching of materials, such as platinum, which require high temperatures to volatilize low volatility etch products as well as routine plasma etching, chemical vapor deposition, sputtering, ion implantation, ashing, etc. The novel design of the removably attached expansion assembly allows the chuck to be scaled for larger workpieces, to remain serviceable through more heating cycles, and to be economically serviced.

29 Claims, 5 Drawing Sheets

U.S. PATENT DOCUMENTS

| | | |
|---|---|---|
| 5,820,723 A | 10/1998 | Benjamin et al. |
| 5,835,334 A | 11/1998 | McMillin et al. |
| 5,867,359 A | 2/1999 | Sherman |
| 5,880,922 A | 3/1999 | Husain |
| 5,882,411 A * | 3/1999 | Zhao et al. ................. 118/715 |
| 5,908,334 A | 6/1999 | Chen et al. |
| 5,930,639 A | 7/1999 | Schuele et al. |
| 5,948,704 A | 9/1999 | Benjamin et al. |
| 5,968,273 A | 10/1999 | Kadomura et al. |
| 6,159,055 A * | 12/2000 | Satitpunwaycha et al. .. 439/700 |
| 6,377,437 B1 * | 4/2002 | Sexton et al. ............... 361/234 |

* cited by examiner

HIGH TEMPERATURE ELECTROSTATIC CHUCK

FIELD OF THE INVENTION

The invention relates to an electrostatic chuck (ESC) useful for processing substrates such as semiconductor wafers. The ESC can be used to support a semiconductor substrate in a plasma reaction chamber wherein etching or deposition processes are carried out. The ESC is especially useful for high temperature plasma etching of materials such as platinum which are not volatile at low temperatures.

DESCRIPTION OF THE RELATED ART

Vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP) which is also called inductively coupled plasma (ICP), and electron-cyclotron resonance (ECR) reactors are disclosed in commonly owned U.S. Pat. Nos. 4,340,462; 4,948,458; and 5,200,232. Vacuum processing chambers are typically designed to meet performance specifications which depend on the process to be carried out therein. Thus, the particular plasma generating source, vacuum pumping arrangement and substrate support associated with the particular processing chamber must be customized or specially designed to meet the performance specifications.

Substrates are typically held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. Nos. 5,262,029, 5,880,922 and 5,671,116. Substrate holders in the form of an electrode can supply radiofrequency (RF) power into the chamber, as disclosed in U.S. Pat. No. 4,579,618. Electrostatic chucks of the monopolar type utilize a single electrode. For instance, see U.S. Pat. No. 4,665,463. Electrostatic chucks of the bipolar type utilize mutual attraction between two electrically charged electrodes which are separated by a dielectric layer. For instance, see U.S. Pat. Nos. 4,692,836 and 5,055,964.

Substrates including flat panel displays and smaller substrates can be cooled by the substrate holder during certain processing steps. Such cooling is performed by the application of a gas, such as helium, between the substrate holder and the opposed surface of the substrate. For instance, see U.S. Pat. Nos. 5,160,152; 5,238,499; 5,350,479; and 5,534,816. The cooling gas is typically supplied to channels or a pattern of grooves in the substrate holder and applies a back pressure to the substrate.

Substrate supports for vacuum processing chambers are typically mounted on a bottom wall of the chamber making servicing and replacement of the substrate support difficult and time consuming. Examples of such bottom mounted substrate supports can be found in U.S. Pat. Nos. 4,340,462; 4,534,816; 4,579,618; 4,615,755; 4,948,458; 5,200,232; and 5,262,029. A cantilevered support arrangement is described in commonly owned U.S. Pat. Nos. 5,820,723 and 5,948,704.

High temperature electrostatic chucks incorporating clamping electrodes and heater elements have been proposed for use in chemical deposition chambers. See, for example, U.S. Pat. Nos. 5,730,803; 5,867,359; 5,908,334; and 5,968,273 and European Patent Publication 628644 A2. Of these, EP'644 discloses an aluminum nitride chuck body having an RF metallic electrode plate which is perforated with holes to form a mesh and a heater embedded therein, the chuck body being supported on an alumina cylinder such that the outer periphery of the chuck body extends beyond the cylinder. The '803 patent discloses a chuck body of silicon nitride or alumina having an electrical grid of Mo, W, W—Mo and a Mo heater coil wire embedded therein, the chuck body being supported by a Mo heat choke cylinder which surrounds a Cu or Al water cooled cooling plate in thermal contact with the chuck body by a thermal grease which allows differential expansion between the chuck body and the cooling plate. The '359 patent describes a chuck operational at temperatures on the order of 500° C., the chuck including sapphire (single crystal $Al_2O_3$) layers brazed to opposite sides of a niobium electrode and that assembly brazed to a metal base plate. The '334 patent describes a chuck for use at temperatures in excess of 175° C., the chuck including polyimide films on either side of a monopolar or bipolar electrode with the lower polyimide film self adhered to a stainless steel platen. The '273 patent discloses a layered chuck body including an aluminum nitride top layer, an electrode, an aluminum nitride layer, a metal plate, a heater, a metal plate and an aluminum composite, the chuck body being supported by a cylinder such that the outer periphery of the chuck body extends beyond the cylinder.

Some ESC designs use a heat conduction gas such as helium to enhance conduction of heat between adjacent surfaces of the wafer support. For instance, U.S. Pat. No. 5,155,652 describes an ESC having layers including an upper pyrolytic boron nitride layer or optionally polyimide, alumina, quartz, or diamond, an electrostatic pattern layer comprised of a boron nitride substrate and a conductive pattern of pyrolytic graphite thereon, a heater layer comprised of a boron nitride substrate and a conductive pattern of pyrolytic graphite thereon, and a heat sink base of KOVAR (NiCoFe alloy with 29% Ni, 17% Co and 55% Fe). The heat sink base includes water cooling channels in a lower portion thereof and chambers in an upper surface thereof which can be maintained under vacuum during heatup of the chuck or filled with helium to aid in cooling of a wafer supported by the chuck. U.S. Pat. No. 5,221,403 describes a support table comprised of an upper member which supports a wafer and a lower member which includes a liquid passage for temperature control of the wafer, the upper member including an ESC constituted by a copper electrode between polyimide sheets and a gap between contacting surfaces of the upper and lower members being supplied a heat conduction gas.

Commonly owned U.S. Pat. No. 5,835,334 describes a high temperature chuck wherein helium is introduced between contacting surfaces of a lower aluminum electrode and an electrode cap which is bolted to the lower electrode, the electrode cap comprising anodized aluminum or diamond coated molybdenum. A protective alumina ring and O-ring seals minimize leakage of the coolant gas between the electrode cap and the lower electrode. The electrode cap includes liquid coolant channels for circulating a coolant such as ethylene glycol, silicon oil, fluorinert or a water/glycol mixture and the lower electrode includes a heater for heating the chuck to temperatures of about 100 to 350° C. To prevent cracking of the anodization due to differential thermal expansion, the electrode cap is maintained at temperatures no greater than 200° C. In the case of the diamond coated molydenum electrode cap, the chuck can be used at higher temperatures.

International Publication WO 99/36956 describes a process for plasma etching a platinum electrode layer wherein a substrate is heated to above 150° C. and the Pt layer is etched by a high density inductivity coupled plasma of an etchant gas comprising chlorine, argon and optionally $BCl_3$, HBr or mixture thereof. U.S. Pat. No. 5,930,639 also describes a platinum etch process wherein the Pt forms an electrode of a high dielectric constant capacitor, the Pt being etched with an oxygen plasma.

Although there have been some attempts to provide improved chuck designs for use at high temperatures, the high temperatures impose differential thermal stresses which are detrimental to use of materials of different thermal expansion coefficients. This is particularly problematic in maintaining a hermetic seal between ceramic materials such as aluminum nitride and metallic materials such as stainless steel or aluminum. As such, there is a need in the art for improved chuck designs which can accommodate the thermal cycling demands placed upon high temperature chuck materials. In particular, as larger work pieces are used to increase productivity and for larger display devices a design which can accommodate greater thermal expansion is needed.

SUMMARY OF THE INVENTION

The invention provides a substrate support useful in a high temperature vacuum processing chamber. In a preferred embodiment, the substrate support is an electrostatic chuck comprising a chuck body, a heat transfer body and an expansion assembly which can form an outer tubulation therebetween. The chuck body comprises an electrostatic clamping electrode and optional heater element, the electrode being adapted to electrostatically clamp a substrate such as a semiconductor wafer on an outer surface of the chuck body. The heat transfer body is separated from the chuck body by a plenum located between spaced-apart surfaces of the chuck body and the heat transfer body. The heat transfer body is adapted to remove heat from the chuck body by heat conductance through a heat transfer gas in the plenum.

The invention also provides an expansion assembly for the substrate support which accommodates differential thermal expansion of the chuck body and the heat transfer body. The expansion assembly attaches an outer periphery of the chuck body to the heat transfer body. According to a preferred embodiment, the expansion assembly forms an outer tubulation which, in combination with the chuck body, an inner tubular section, and the heat transfer body, encloses the plenum. A vacuum seal between the chuck body and the expansion assembly maintains a hermetic seal of the plenum during thermal cycling of the chuck body. Preferably the seal is a compressible metal seal, most preferably a C-ring seal.

According to a preferred embodiment, the heat transfer body comprises a cooling plate having at least one coolant passage therein in which coolant can be circulated to maintain the chuck body at a desired temperature and the plenum is an annular space extending over at least 50% of the underside of the chuck body. In this embodiment, the heat transfer body includes a gas supply passage through which heat transfer gas flows into the annular space. According to a preferred embodiment, the chuck body includes gas passages extending between the plenum and the outer surface of the chuck body. The gas passages can be provided in any suitable arrangement. For instance, if the outer portion of the chuck body tends to become hotter than the central portion thereof, the gas passages can be located adjacent to the expansion assembly so that the heat transfer gas flows from the plenum to the underside of an outer periphery of the substrate during processing thereof. In a preferred embodiment, the substrate can be heated controllably to above about 80° C., more preferably above about 200° C. up to about 350° C. or higher. In a preferred embodiment, heat conduction between the chuck body and the heat transfer body through the expansion assembly is limited by a thin annular section functioning as an expansion joint and heat choke so that heat transfer is modulated by controlling the pressure of heat transfer gas in the plenum. In a more preferred embodiment, direct heat conduction from a high temperature zone which comprises the chuck body and a low temperature zone comprising the heat transfer body (i.e., a cooling plate) through the expansion assembly heat choke is limited such that the temperature difference between the outer perifery of the chuck body and an inner portion of the chuck body is less than about 4 to 5° C., most preferably less than about 2° C.

According to the preferred embodiment, the chuck body comprises a metallic material such as aluminum or alloy thereof or a ceramic material such as aluminum nitride. Lift pins can be used to raise and lower a substrate. For instance, the heat transfer body can include lift pins such as cable actuated lift pins mounted thereon, the lift pins being movable towards and away from the chuck body such that the lift pins travel through holes in the chuck body to raise and lower a substrate onto and off of the chuck body.

The expansion assembly can include a lower mounting flange adapted to attach to the heat transfer body and an expansion joint such as a flexible metal part which can also function as a heat choke. The expansion joint can comprise an inner annular section connected to the lower flange by a curved section and welded or brazed to an upper mounting flange or vice versa. The chuck body may be attached to the upper mounting flange of the expansion assembly by a clamping arrangement such as a continuous clamping ring or a sectioned ring. A hermetic seal is provided between the chuck body and the upper mounting flange by a seal member such as a metal C-ring seal compressed between the outer peripheral lower surface of the chuck body and the top surface of the upper mounting flange of the expansion assembly. The clamping ring may be made of material chosen with a thermal expansion coefficient matched to that of the chuck body to minimize strain of the clamping ring during thermal cycling of the chuck body.

The chuck body can include a ceramic or metallic tubular section extending from a central portion of the underside of the chuck body such that an outer surface of the tubular section defines a wall of the plenum, the tubular section being supported in floating contact with the heat transfer body with a hermetic seal therebetween. The interior of the tubular section can include power supplies supplying RF and DC power to the clamping electrode and AC power to the heater element, and/or a temperature measuring arrangement for monitoring temperature of the chuck body.

According to an embodiment of the invention, the chuck is a replaceable electrostatic chuck for a vacuum processing chamber wherein the chuck includes a chuck body attachable to an expansion assembly. The chuck comprises an electrode having an electrical contact attachable to an electrical power supply which energizes the electrode sufficiently to electrostatically clamp a substrate on an outer surface of the chuck body. According to an embodiment of the invention, the electrostatic chuck comprises a conveniently replaceable expansion assembly and a conveniently replaceable chuck body so that the useful life of the electrostatic chuck may be extended through economical servicing. The invention therefore also provides an expansion assembly adapted to be removably attached between a chuck body and a heat transfer body of the present invention.

The invention also provides a method of processing a substrate in a vacuum process chamber wherein the substrate is electrostatically clamped on a chuck body. The method comprises clamping a substrate on an outer surface of the electrostatic chuck of the present invention by energizing the electrode, heating the substrate with a heating element in the chuck body, supplying a heat transfer gas to the plenum, the gas passing through holes in the chuck body to a gap between an underside of the substrate and the outer surface of the chuck body, controlling the temperature of chuck body and the substrate by heat conductance through the heat transfer gas supplied to the plenum, and processing the substrate.

According to a preferred embodiment, the method further comprises supplying process gas to the chamber and energizing the process gas into a plasma and etching an exposed surface of the substrate with the plasma during the processing step. However, an exposed surface of the substrate can be coated during the processing step. The process gas can be energized into the plasma by any suitable technique such as supplying radiofrequency energy to an antenna which inductively couples the radiofrequency energy into the chamber. During the processing step, the substrate can be heated by supplying power to a heater element embedded in the chuck body. Prior to clamping the substrate, the substrate can be lowered onto the outer surface of the chuck body with lift pins mounted on the heat transfer body, the lift pins passing through openings in an outer portion of the chuck body. In order to withdraw heat from the chuck body, the method can include circulating a liquid coolant in the heat transfer body. Temperature changes in the substrate can be monitored with a temperature sensor supported by the heat transfer body and extending through a hole in the chuck body. In the case of plasma etching a layer of platinum during the processing step, the substrate can be heated to a temperature of over 200° C.

According to the method, it is possible to achieve a desired heat distribution across the chuck body by removing heat from the chuck body through multiple heat paths. Further, it is possible to adjust the amount of heat removed through these heat paths by changing the pressure of the heat transfer gas in the plenum. For instance, since the ceramic or metallic tubular extension at a central portion of the underside of the chuck body conducts heat from the chuck body to the heat transfer body, the method can include adjusting pressure of the heat transfer gas in the plenum so that heat removed through a first heat path provided by the heat transfer gas in the plenum balances heat removed through a second heat path provided by an outer tubulation and heat removed through a third heat path provided by the central tubular extension.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Figure 1:
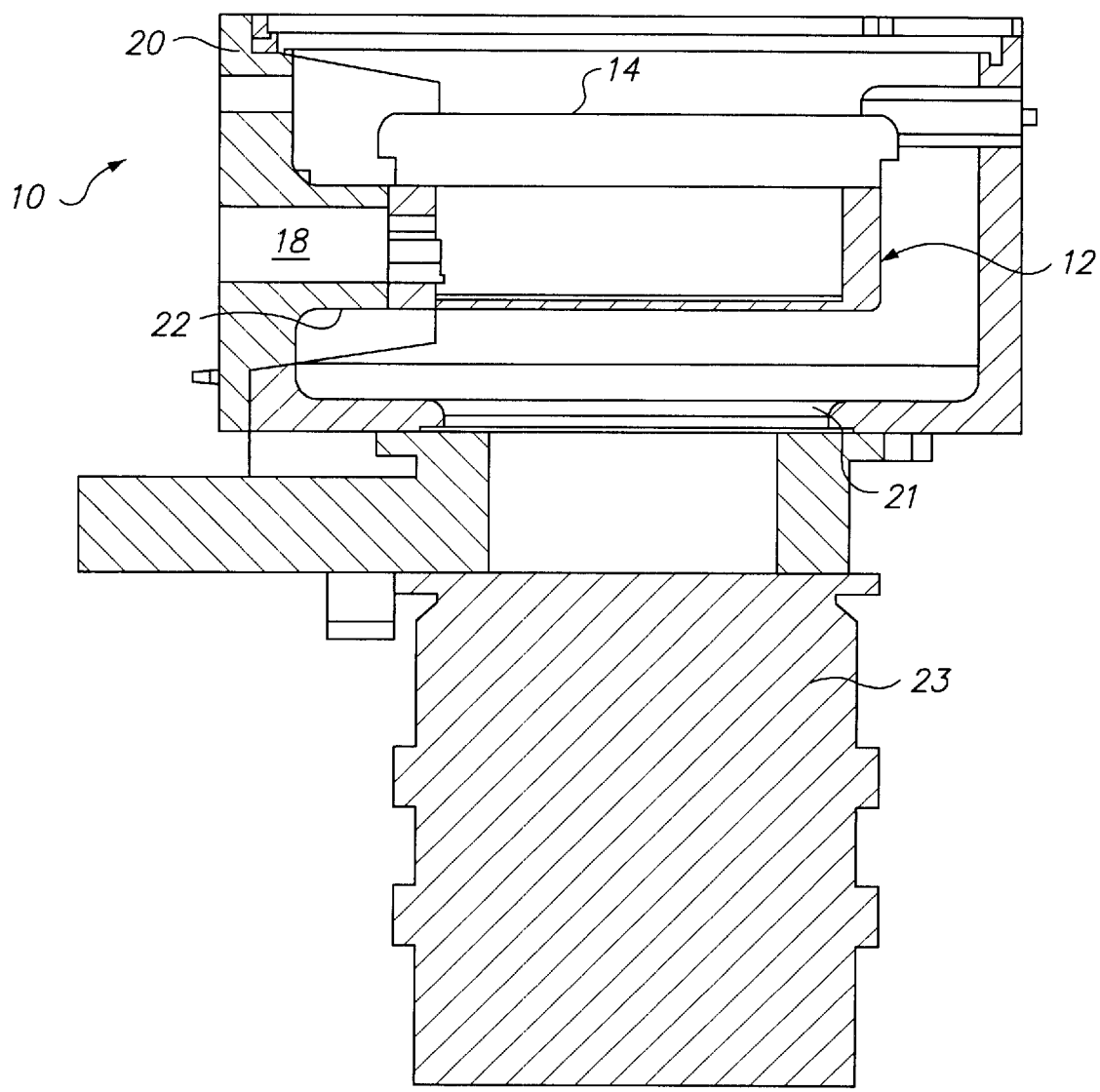
FIG. 1 shows a cross-section of a vacuum processing chamber in which a HTESC assembly of the present invention can be implemented.

The invention provides a substrate support for use in a high temperature vacuum processing chamber. In a preferred embodiment, the support is an electrostatic chuck useful for clamping substrates such as semiconductor wafers during processing thereof in a vacuum processing chamber such as a plasma etch reactor. The electrostatic chuck, however, can be used for other purposes such as clamping substrates during chemical vapor deposition, sputtering, ion implantation, resist stripping, etc.

According to a preferred embodiment of the invention, the chuck includes a clamping electrode and an optional heating element which can be used to maintain the substrate supported on the chuck at elevated temperatures above 80° C. (the upper limit of certain conventional chucks is 60° C.), preferably over 200° C., for example 250 to 500° C. For example, the chuck can be used to support a wafer during chemical vapor deposition or plasma etching of materials wherein it is necessary to heat the substrate to temperatures on the order of about 150° C. and above.

In order to achieve such high temperatures without damage to the chuck, the invention provides an expansion assembly for the electrostatic chuck. The chuck design, and particularly the expansion assembly provides the chuck with high temperature functionality in a small package.

According to a preferred embodiment, the expansion assembly forms an outer tubulation which creates a plenum between spaced apart surfaces of an actively heated portion of the chuck and an actively cooled portion of the chuck. The plenum is filled with a heat transfer gas to conduct heat from the heated portion to the cooled portion of the chuck. A hermetic seal is maintained between the expansion assembly and the chuck body by a metal seal such as a C-ring seal. With this arrangement, it is not necessary to use any elastomer seals in the heated portion of the chuck, thereby allowing the heated portion of the chuck to operate at temperatures above which elastomer seals would break down. Also, because of the plenum and a heat choke member of the expansion assembly, the cooling plate can be maintained at a low enough temperature to permit use of low cost elastomer seals in contact with surfaces of the expansion assembly and the cooling plate. Moreover, the expansion assembly design provides a small overall height of the chuck which makes the chuck compatible with tight system packaging requirements (footprint). A further advantage of the expansion assembly is that thermal stresses can be accommodated between the heated and cooled portions of the chuck. A further advantage is that the chuck according to the invention can be scaled to accommodate work pieces larger than 200 mm, e.g., 300 mm wafer. In addition, a heat transfer gas such as helium can be supplied to targeted locations on the underside of the substrate without the need for a complicated arrangement of gas passages inside the chuck.

According to a preferred method of using the chuck according to the invention, a low volatility etch product can be removed from a substrate by a plasma etch process wherein the substrate is heated by the chuck. Such low volatility etch products can be formed during plasma etching of noble metals such as Pt, Pd, Ru, Ir and compounds thereof as well as $ZrO_2$ and $HfO_2$, materials under consideration as the electrodes of capacitors or transistors using high-k dielectric materials. Such low volatility etch products remain on the substrate surface unless the substrate is heated sufficiently. For example, platinum chloride formed during etching of platinum can be volatilized at militorr pressures by heating the substrate to around 200° C. Conventional chucks used in low temperature etch processes are unsuited for such high temperature environments since they can undergo damaging thermal cycling which ruptures hermetic seals and/or causes failure of chuck materials. Further, because the water cooled portions of such conventional chucks are in direct thermal contact with the heated portion of the chuck, the heat from the chuck can cause the cooling fluid to boil and result in uneven cooling of the chuck and/or insufficient cooling of the chuck. The chuck according to the present invention solves these problems through use of the expansion assembly design.

According to a preferred embodiment, the chuck body is made from a metallic or ceramic material having desired electrical and/or thermal properties. For example, the chuck body can be made of aluminum or an aluminum alloy. Alternatively, the chuck body can be made from one or more ceramic materials including nitrides such as aluminum nitride, boron nitride and silicon nitride, carbides such as silicon carbide and boron carbide, oxides such as alumina, etc. with or without fillers such as particles in the form of whiskers, fibers or the like or infiltrated metals such as silicon. A ceramic chuck body can be formed by various techniques. For instance, the ceramic material can be formed into a monolithic body by a powder metallurgical technique wherein ceramic power is formed into a chuck body shape such as by compacting or slip casting the powder with the clamping electrode, heater and power supply connections embedded therein, the chuck body being densified by sintering the powder. Alternatively, the chuck body can be formed from sheets of ceramic material which are overlaid with electrically conductive patterns for the clamping electrode, the heater and power feedthroughs incorporated therein, the layers being cofired to form the final chuck body.

An exemplary embodiment of a high temperature electrostatic chuck (HTESC) assembly according to the invention is now described with reference to FIGS. 1–6. The HTESC assembly offers advantageous features such as high temperature functionality, relatively low power requirements, longer operational life, simple backside cooling, lower manufacturing cost and compact design, and scalability to larger work pieces.

The HTESC according to the invention can offer better high temperature functionality and relatively low power requirements compared to conventional chuck assemblies wherein a cooling plate is integrated in a one-piece electrostatic chuck. In such conventional chuck arrangements, the maximum operational temperature is limited to approximately 60° C. In order to increase the maximum operational temperature, the HTESC of the present invention has been designed as a two-piece assembly, including an ESC portion such as a ceramic chuck body having an electrostatic clamping electrode embedded therein and a heat transfer body such as a cooling plate. In addition, an expansion assembly preferably comprising a thin deflectable annular section which functions as a heat choke has been integrated into the chuck for thermally isolating the ESC portion from the cooling plate. The heat choke section significantly reduces conduction of heat from the edge of the ESC portion to the cooling plate, thereby allowing the ESC portion to reach temperatures as high as approximately 350° C. or higher without requiring the supply of a relatively large amount of power to a heater element embedded in the chuck body.

The expansion assembly provides an extended operational life of the HTESC. In particular, by use of the expansion assembly, the ESC portion can undergo substantial thermal expansion without damaging other parts of the HTESC. A replaceable seal between the ESC and the expansion assembly further extends the service life of the HTESC. The expansion assembly can be designed as a single-piece or multi-piece welded or brazed assembly comprising a thin-walled annular section allowing thermal expansion and contraction of the ESC portion while minimizing heat conduction from the ESC portion to the cooling plate. The thin-walled annular heat choke section accommodates differential thermal expansion between the ESC portion and the cooling plate, thereby minimizing stresses within the HTESC assembly and thus reducing the chance of premature failure of the HTESC assembly. Furthermore, the heat choke section can be designed in a manner which reduces stress at brazed joints within the HTESC assembly.

Compared to conventional chuck assemblies which rely on a complicated gas distribution arrangement inside the ESC portion to adequately cool the substrate, the HTESC according to the present invention can include a simple arrangement which selectively targets portions of the substrate where more cooling is desired. For instance, the HTESC assembly includes a plenum between the ESC portion and the cooling plate and the ESC portion can be cooled by a heat transfer gas supplied to the plenum and the substrate can be temperature controlled by supplying the heat transfer gas to select portions of the substrate through passages extending from the plenum to the outer surface of the ESC portion. In a HTESC used for plasma etching, gas distribution holes can be provided near the outer periphery of the ESC portion to enhance the cooling of the outer portion of the substrate. Thus, a complicated gas distribution arrangement is not necessary since the gas distribution holes can be formed at desired locations in the support surface of the ESC portion.

Compared to other high temperature chuck assemblies, the use of the expansion assembly in the HTESC of the present invention can reduce manufacturing costs and/or simplify manufacture of the HTESC. In particular, because the heat choke member thermally isolates the hot ESC portion from the cooling plate, standard low cost elastomer seals can be used at locations in contact with the cooling plate. Furthermore, the removably attached expansion assembly allows replacement of the high temperature vacuum sealing member between the expansion joint and the ESC body.

Figure 2:
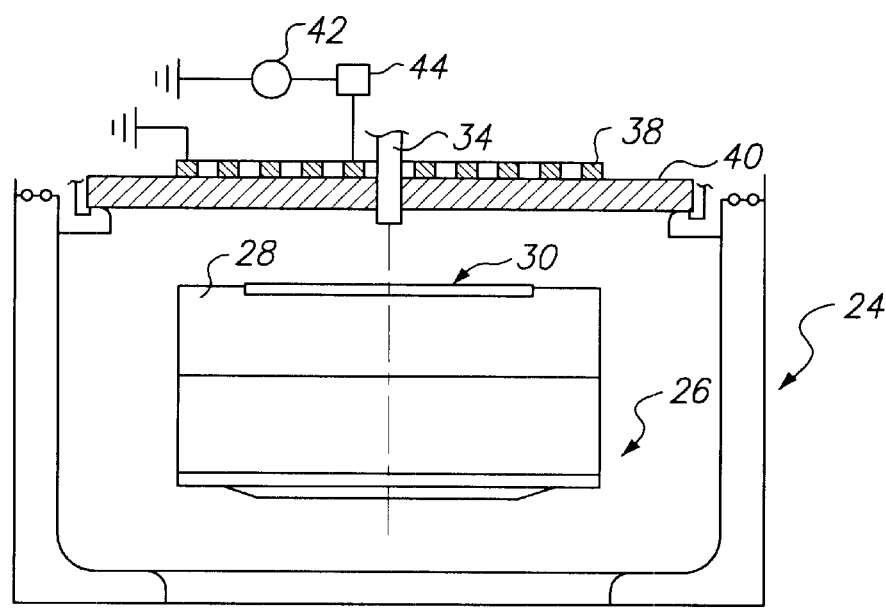
FIG. 2 shows a cross-section of another processing chamber in which the HTESC assembly of the present invention can be implemented.
Figure 3:
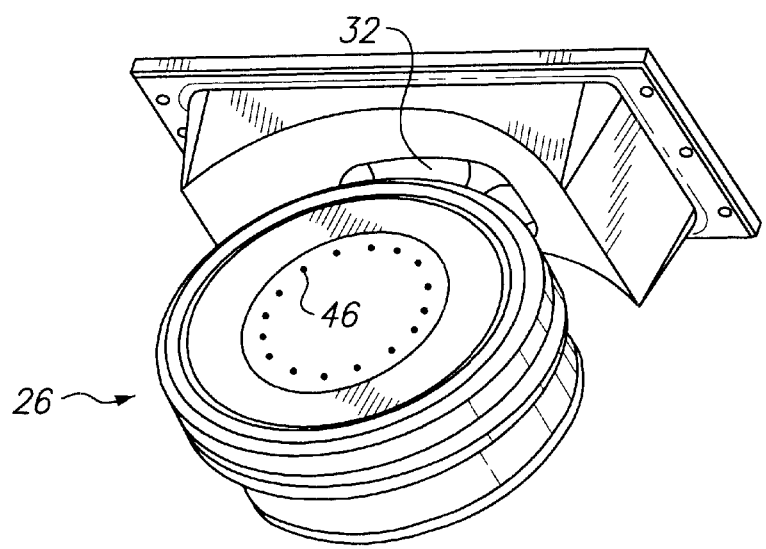
FIG. 3 shows a perspective view of the cantilevered substrate support of FIG. 2.

The HTESC according to the invention is designed to provide a small overall height so that it can be used in vacuum chambers wherein the chuck is supported on a cantilevered support arm. For example, FIGS. 1–3 illustrate examples of vacuum processing chambers 10, 24 into which an HTESC assembly of the present invention could be mounted. While the invention will be explained with reference to the chamber design shown in FIGS. 1–3, it will be appreciated by those skilled in the art that the HTESC assembly of the present invention can be used in any vacuum processing chamber wherein it is desired to electrostatically clamp a substrate. For example, the HTESC assembly of the present invention could be used as part of a substrate support in processing chambers where various semiconductor plasma or non-plasma processing steps such as etching, deposition, resist stripping, etc. can be performed.

As shown in FIG. 1, the vacuum chamber 10 includes a cantilevered substrate support 12 extending inwardly from a sidewall of the chamber and a HTESC 14 is supported by the support 12. A service passage 18 containing service conduits (not shown) opens into an interior of the support 12. The service conduits can be used to service the HTESC, e.g., supply DC power to a clamping electrode, supply RF power to the clamping electrode or a separate electrode which provides an RF bias to the substrate during processing thereof, supply AC power to a heater element, house cables for actuating lift pins, supply coolant for cooling the HTESC and/or the substrate, transmit electrical signals from sensors or monitoring equipment, etc.

In the embodiment shown, a mounting flange 20 and support arm 22 form an integral piece which can be removably mounted in an opening in the chamber, e.g., by mechanical fasteners with an O-ring and RF shielding interposed between opposed surfaces of the flange 20 and the chamber. In the arrangement shown in FIG. 1, gas within the chamber can be withdrawn through an opening 21 by a vacuum pump 23. Plasma can be generated in the chamber by a source of energy (not shown) mounted at the top of the chamber. That is, the top of the chamber is designed to support various types of plasma generating sources such as capacitive coupled, inductive coupled, microwave, magnetron, helicon, or other suitable plasma generating equipment. Also, process gas can be supplied to the chamber by various types of gas supply arrangements such as a gas distribution plate (showerhead), one or more gas rings and/or gas injectors, or other suitable arrangement.

FIG. 2 illustrates a vacuum processing chamber 24 and a cantilevered substrate support 26 on which a chuck assembly 28 has been mounted. As shown, a substrate 30 is supported on a HTESC assembly 28 mounted on the substrate support 26. The substrate support 26 is at one end of a support arm 32 (shown in FIG. 3) mounted in a cantilever fashion such that the entire substrate support/support arm assembly 26/32 can be removed from the chamber by passing the assembly through an opening (not shown) in the sidewall of the chamber 24. Process gas can be supplied to the chamber by any suitable arrangement such as a gas supply pipe 34 or a gas distribution plate and the gas can be energized into a plasma state by an antenna 38 such as a planar coil which inductively couples RF energy through a dielectric member 40. The antenna can be supplied RF energy by any suitable arrangement such as a conventional RF power generator 42 and a match network 44. During processing of a wafer, a heat transfer gas such as helium can be supplied to the backside of the wafer through holes 46, as shown in FIG. 3.

In the chambers shown in FIGS. 1–3, it is desirable to minimize the height of the HTESC to allow easy removal of the substrate support 26 including the HTESC from the chambers 10, 24. Details of an exemplary HTESC according to the present invention which provides extended service life, economical manufacture, maintenance and operation with a compact design will now be explained with reference to the embodiments shown in FIGS. 4–6.

Figure 4:
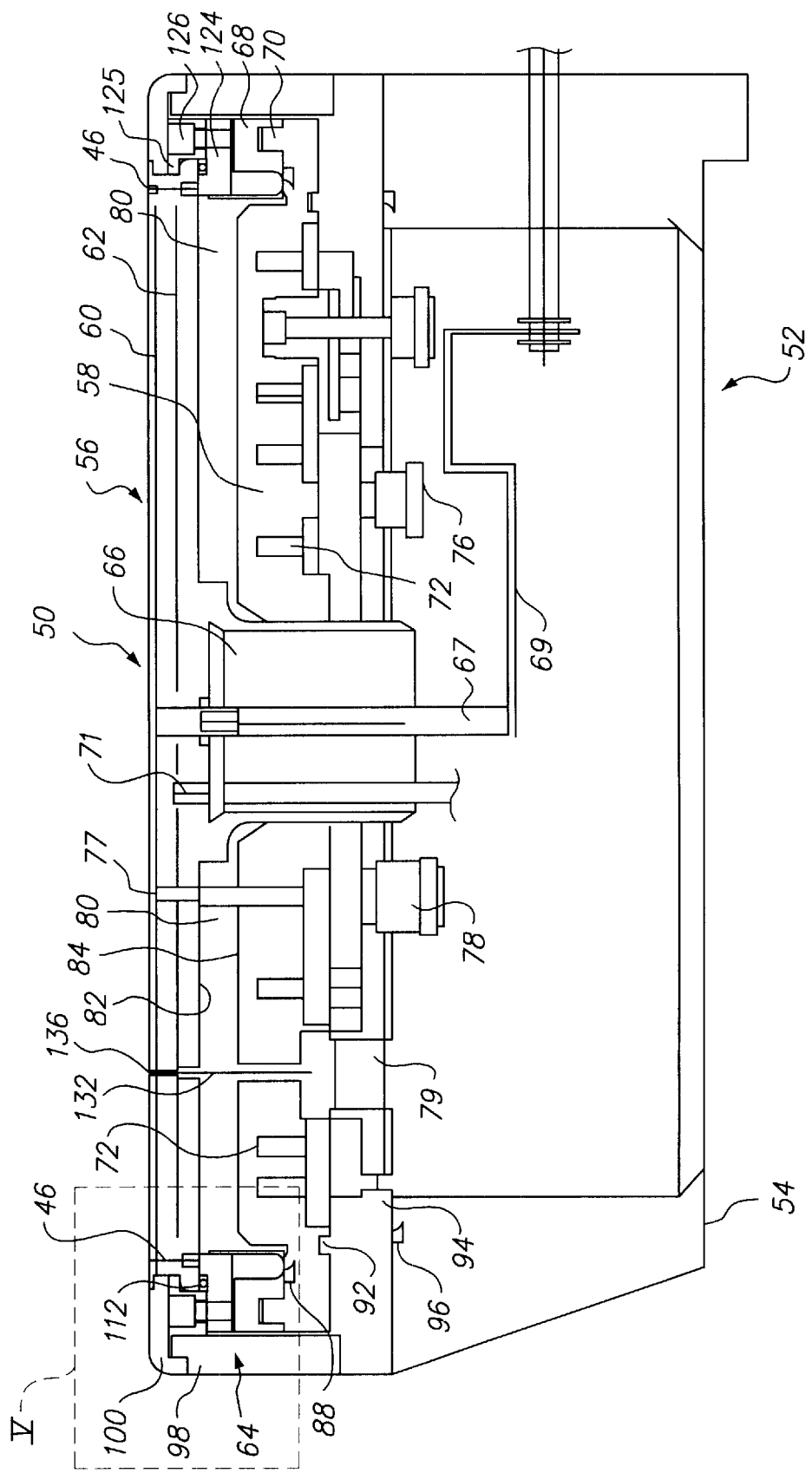
FIG. 4 shows a cross-section of a HTESC assembly of an embodiment of the present invention.
Figure 6:
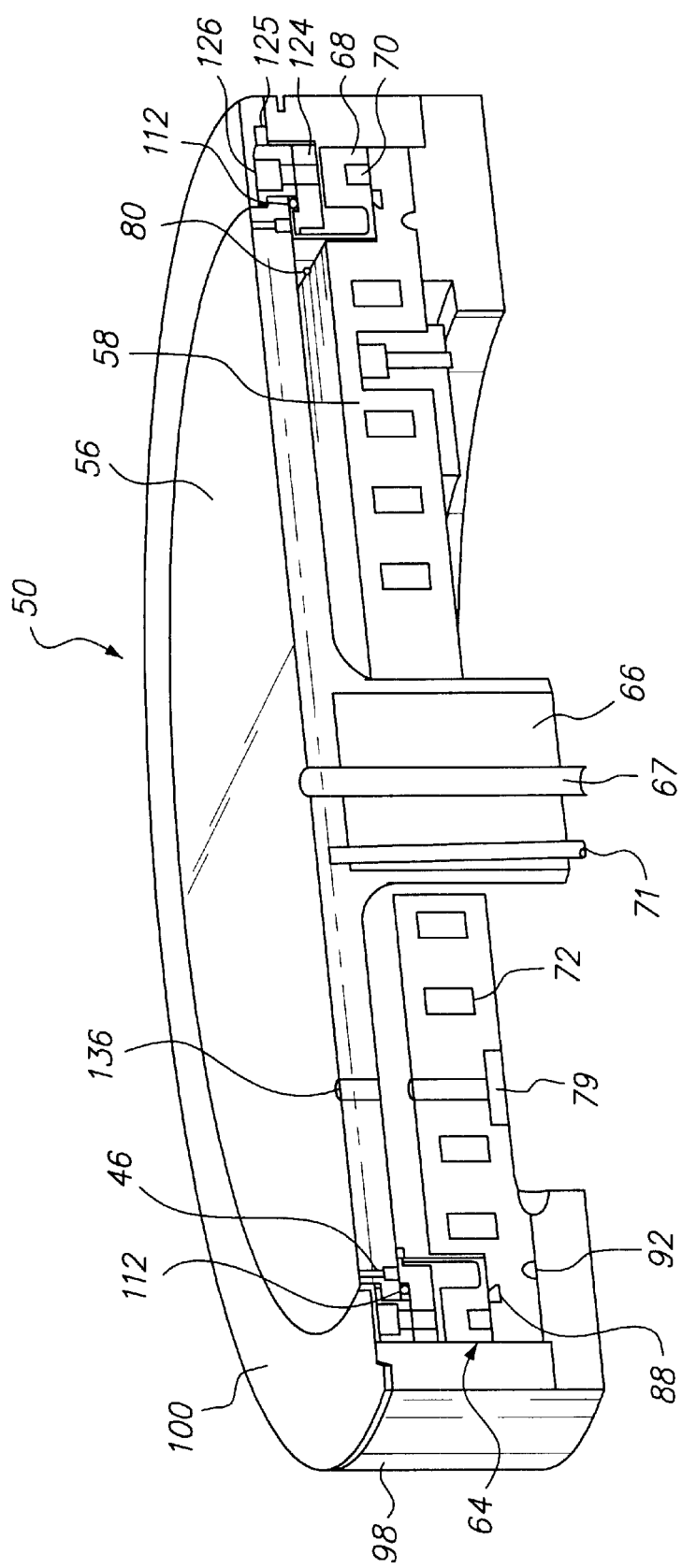
FIG. 6 shows a cut-away perspective view of the HTESC of FIG. 4.

FIG. 4 shows a HTESC assembly 50 according to a first embodiment of the present invention wherein the HTESC assembly 50 may be mounted on a cantilevered substrate support in a vacuum processing chamber as discussed above with reference to FIGS. 1–3. FIG. 6 shows the HTESC 50 in a cut-away perspective view. The HTESC assembly 50 is a two-piece design including a chuck body 56 and a heat transfer body 58. The chuck body 56 includes a clamping electrode 60, an optional heater element 62, and a central tubular extension 66. An expansion assembly 64, which may serve as a heat choke and which forms an outer tubulation, includes a lower annular mounting flange 68 which is removably attached to the heat transfer body 58 by bolts (not shown) and aligned by pins 70. An upper annular mounting flange 124 is removably attached to a ring 125 by bolts 126 which serves to clamp the chuck body 56 to the upper mounting flange 124. The chuck body 56 is preferably made of a ceramic material exhibiting dielectric properties such as aluminum nitride. The expansion assembly 64 and the heat transfer body 58 can be made of heat conducting metals such as aluminum, copper, titanium and alloys thereof. However, a preferred material is a heat conducting metal such as stainless steel, cobalt, nickel, molybdenum, zirconium or alloys thereof. Alternatively, the expansion assembly 64 and the heat transfer body can be made of any materials compatible in a vacuum chamber in which semiconductor substrates are processed.

The heat transfer body 58 includes coolant passages 72 and coolant such as water or other coolant can be supplied to the passages 72 by suitable conduits. Electrical power can be supplied to the clamping electrode 60 and the heater element 62 by power supply lines in tubular extension 66. For instance, RF and DC power can be supplied to the clamping electrode by a rod 67, the bottom of which is connected to a strap 69. Temperature of the chuck body can be monitored with a temperature feedback assembly 71 in the tubular extension 66.

A plenum 80 is provided between spaced apart surfaces 82 and 84 of the chuck body 56 and the heat transfer body 58. A heat transfer gas such as helium can be supplied to the plenum 80 by a gas conduit 76. The temperature of the substrate on the chuck body can be monitored with a fiberoptic element 77 supported in a fitting 78. Although any type of lift pin assembly can be used such as a pneumatically actuated lift pin assembly, according to a preferred embodiment the substrate can be raised and lowered by a plurality of cable actuated lift pins, each of which can comprise a fitting mounted in a bore 79 and a cable actuated lift pin. Elastomer seal 88 fitted in a groove in the heat transfer body 58 provides a vacuum seal between the expansion assembly 64 and the heat transfer body 58. An elastomer seal 92 provides a vacuum seal between an underside of the heat transfer body 58 and a dielectric mounting plate 94 and an elastomer seal 96 provides a vacuum seal between an underside of the mounting plate 94 and housing 54 of the substrate support. A dielectric edge ring 98 (e.g., alumina, silicon nitride, quartz, etc.) overlies the mounting plate 94 and a dielectric focus ring 100 (e.g., alumina, silicon nitride, silicon carbide, etc.) overlies the edge ring 98 and surrounds the chuck body 56.

Figure 5:
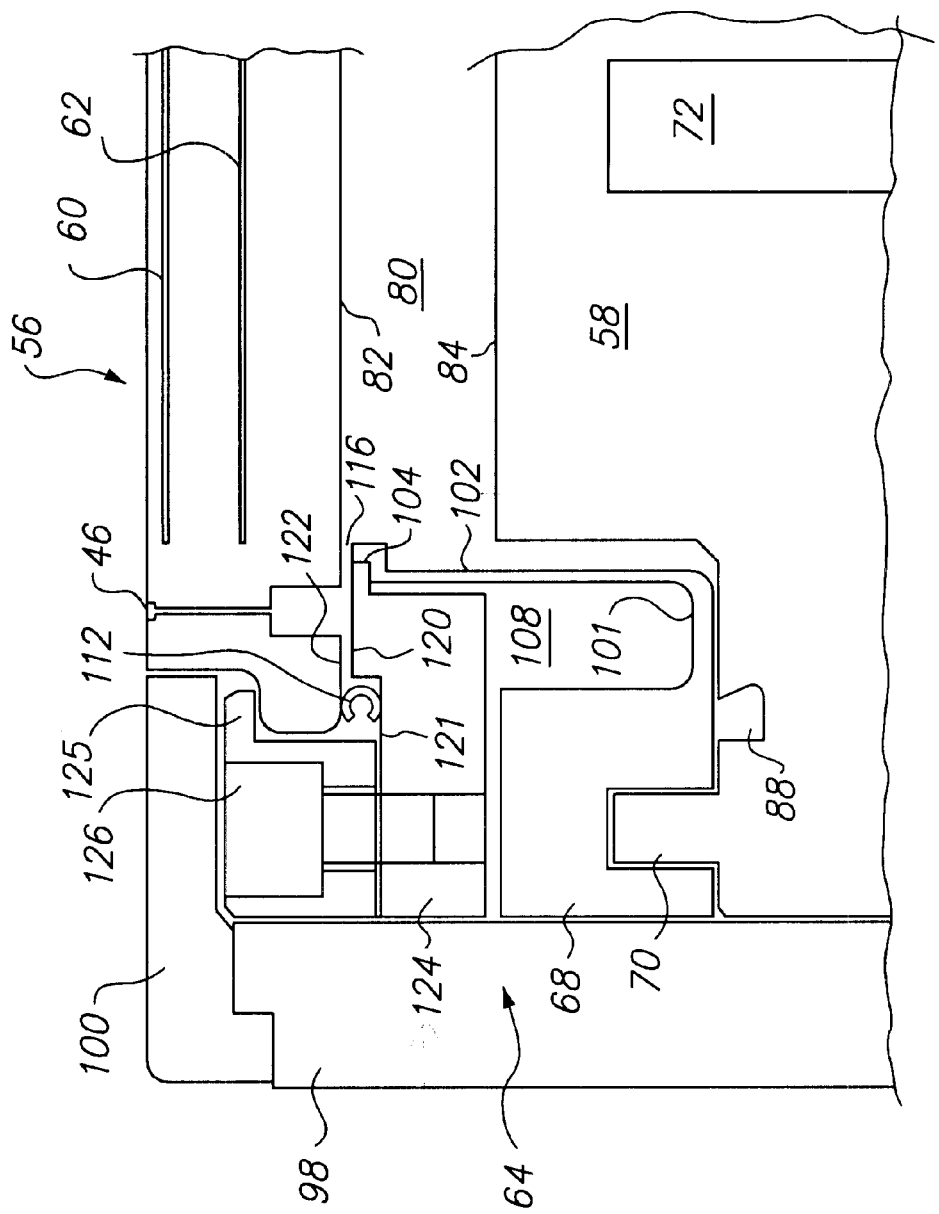
FIG. 5 shows details of a portion of the HTESC assembly shown in FIG. 4.

FIG. 5 shows details of the chuck body 56 with the expansion assembly 64 attached thereto. As shown in FIG. 5, the expansion assembly 64 includes the lower mounting flange 68, an inner annular section 102 functioning as an expansion joint and heat choke, an upper mounting flange 124, and a welded or brazed joint 104. The inner annular break section 102 is connected to the lower flange 68 by a curved section 101 and to the upper mounting flange 124 by the joint 104. The inner annular section 102 is separated from the flange 68 by an annular space 108. The flange 68 and the inner annular section 102 can be formed (e.g., machined, cast, forged, etc.) out of a single piece of metal such as stainless steel.

The chuck body 56 is clamped to the upper mounting flange 124 by a clamping arrangement such as a ring 125 which is removably secured to the upper mounting flange by bolts 126. A small gap is between a top surface 120 of the upper mounting flange 124 and the lower surface 122 of the chuck body 56. A C-ring 112 positioned between surface 121 of the upper mounting flange and bottom surface 122 of the chuck body 56 maintains a hermetic seal of the plenum 80.

When the chuck body 56 heats up and expands, the outside diameter of the chuck body 56 presses against the clamping ring 125 and elastically deflects the expansion joint 102. The curved section 101 and inner annular section 102 undergo elastic deformation to accommodate thermal expansion and contraction of the chuck body 56. Thus, mechanical stress on chuck body 56 is minimized. The clamping ring 125 can be made of material to match the thermal expansion of the chuck body 56.

The substrate can be raised and lowered with any suitable lift pin arrangement such as a pneumatically actuated lift pin assembly or a cable actuated assembly described above. For example, the lift pin assembly can include a plurality of lift pins 132, each of which can be raised and lowered by a cable (not shown) attached to a slidable lift pin support in a housing. The housing is fitted in the bore 79 so as to maintain a hermetic seal. A further description of such cable actuated lift pins can be found in commonly owned U.S. Pat. No. 5,796,066. The lift pin hole 136 is sized to allow movement of the lift pin 132 and heat transfer gas in the plenum 80 can flow around the lift pin 132 to the underside of a substrate located in overhanging relationship with the chuck body 56.

The heat transfer gas can be supplied to the plenum 80 through a gas passage 76 and the gas in the plenum can be maintained at any suitable pressure such as 2 to 20 Torr. Depending on the size of the substrate, 3 or more lift pins 132 can be used to raise and lower the substrate. As shown in FIGS. 4 and 5 additional holes 46 can be provided to evenly distribute the gas around the edge of the substrate. Further, the holes can open into a shallow groove (not shown) in the upper surface of the chuck body to aid in distributing the gas under the substrate. In order to provide power to the clamping electrode and the heater element, power supplies can be provided in the interior of the tubular extension 66. Also, one of the power supplies can be used to carry electrical signals to a chuck body temperature sensor 71 and a substrate temperature sensor (not shown) mounted in opening 77.

The thin cross-section of the inner annular section 102 of the expansion assembly allows for the thermal isolation of the chuck body from the remainder of the HTESC assembly. By thermally isolating the chuck body and thereby minimizing heat loss due to heat conduction away from the chuck body, the chuck body is capable of reaching temperatures as high as about 350° C. or higher without requiring the expenditure of a relatively large amount of electrical power. In addition, the shape of the inner annular expansion joint and heat choke 102 and curved section 101 allows the joint to expand and contract as a result of thermal cycling during processing of a substrate. Accordingly, because thermal stresses on welded and brazed joints of the HTESC assembly are minimized, the HTESC can be expected to have a long working life.

By thermally isolating the chuck body from the rest of the HTESC assembly, standard low cost elastomer materials can be used to form vacuum seals with the heat transfer body. Such vacuum seals can be made from a low cost material such as VITON. The chuck body can be made from cofired layers of ceramic material and metallization layers. For example, commonly owned U.S. Pat. No. 5,880,922 describes a suitable technique for making a ceramic chuck body. For example, the layers can include a conductive layer forming a monopolar or bipolar electrode (which also functions as a RF bias electrode) sandwiched between ceramic layers. A heater element such as one or more spiral resistance heating elements can be located between additional ceramic layers. Various conductive feedthroughs for supplying power to the clamping electrode and heater element can also be incorporated in the chuck body.

While the invention has been described in detail with reference to preferred embodiments thereof, it will be apparent to one skilled in the art that various changes can be made, and equivalents employed, without departing from the scope of the invention.

What is claimed is:

1. An electrostatic chuck useful in a high temperature vacuum processing chamber comprising:
   a chuck body comprising an electrostatic clamping electrode and an optional heater element, the electrode being adapted to electrostatically clamp a substrate on an outer surface of the chuck body;
   a heat transfer body separated from the chuck body by a plenum located between spaced apart surfaces of the chuck body and the heat transfer body, the heat transfer body being adapted to remove heat from the chuck body by heat conductance through a heat transfer gas in the plenum; and,
   a removably attached expansion assembly connecting an outer periphery of the chuck body to the heat transfer body, the expansion assembly accommodating differential thermal expansion of the chuck body and the heat transfer body.

2. The electrostatic chuck of claim 1, wherein the expansion assembly comprises a deformable annular section.

3. The electrostatic chuck of claim 2, wherein the deformable annular section limits direct conduction of heat between the chuck body and the heat transfer body thereby functioning as a heat choke.

4. The electrostatic chuck of claim 2, wherein the expansion assembly further comprises first and second mounting flanges; and wherein the deformable annular section is connected to one of the mounting flanges by a curved section.

5. The electrostatic chuck of claim 2, wherein the expansion assembly further comprises first and second mounting flanges; and wherein the deformable annular section is connected to one of the mounting flanges by a brazed or welded joint.

6. The electrostatic chuck of claim 1, further comprising a clamping arrangement removably attaching the chuck body to the expansion assembly.

7. The electrostatic chuck of claim 6, wherein the clamping arrangement abuts an outer edge of the chuck body and compresses a metal seal between the chuck body and the expansion assembly.

8. The electrostatic chuck of claim 7, wherein the metal seal is a C-ring seal.

9. The electrostatic chuck of claim 6, wherein the clamping arrangement comprises a clamping ring.

10. The electrostatic chuck of claim 1, wherein the heat transfer body comprises a cooling plate having at least one coolant passage therein in which coolant can be circulated to maintain the chuck body at a desired temperature, the plenum is an annular space which extends over at least 50% of the underside of the chuck body, and the heat transfer body includes a gas supply passage through which heat transfer gas flows into the plenum.

11. The electrostatic chuck of claim 1, wherein the expansion assembly defines an outer wall of the plenum and maintains a hermetic seal to the chuck body and the heat transfer body during thermal cycling of the chuck body.

12. The electrostatic chuck of claim 1, wherein the chuck body includes gas passages extending between the plenum and the outer surface of the chuck body, the gas passages optionally being located adjacent the expansion assembly and supplying heat transfer gas from the plenum to the underside of an outer periphery of the substrate during processing thereof.

13. The electrostatic chuck of claim 1, wherein the chuck body comprises a metallic material or a ceramic material.

14. The electrostatic chuck of claim 13, wherein the chuck body comprises a ceramic material selected from the group consisting of aluminum nitride, silicon nitride, boron nitride, silicon carbide, boron carbide, alumina and mixtures thereof.

15. The electrostatic chuck of claim 1, further comprising a ceramic or metallic tubular section extending from a central portion of the underside of the chuck body, an outer surface of the tubular section defining a wall of the plenum; the interior of the tubular section optionally comprising an arrangement supplying power to the clamping electrode, an arrangement supplying power to the heater element, and/or an arrangement monitoring temperature of the chuck body; and the interior of the tubular section being optionally open to atmospheric pressure.

16. A method for processing a substrate in a vacuum processing chamber comprising the steps of:

electrostatically clamping a substrate on an outer surface of the electrostatic chuck of claim 1;

optionally heating the substrate with a heating element in the chuck body;

controlling the temperature of the substrate and the chuck body by heat transfer gas supplied to the plenum which may optionally also pass through holes in the chuck body to a gap between the chuck body and the underside of the substrate; and, processing the substrate.

17. The method of claim 16, wherein the substrate is uniformly heated to a temperature above 150° C.;

the chuck body and heat transfer body are thermally isolated by the plenum and a deformable annular heat choke section of the expansion assembly; and the useful life of the electrostatic chuck is increased because temperature related mechanical stress is minimized by the expansion assembly.

18. The method of claim 16, wherein the step of processing the substrate comprises:

providing a process gas to the processing chamber;

energizing the process gas into a plasma state; and, etching an exposed surface of the substrate with the plasma.

19. The method of claim 16, wherein the step of processing the substrate comprises depositing a coating on the substrate.

20. The method of claim 16, wherein the step of processing the substrate comprises chemical vapor deposition, plasma vapor deposition, sputtering, ion implantation or plasma etching.

21. An expansion assembly for a substrate support useful in a high temperature vacuum processing chamber, the substrate support including a chuck body optionally comprising a heater element and/or an electrode adapted to electrostatically clamp a substrate on an outer surface of the chuck body, the substrate support further including a heat transfer body adapted to remove heat from the chuck body by conductance through a heat transfer gas in a plenum located between spaced-apart surfaces of the chuck body and the heat transfer body, the expansion assembly comprising:

a first mounting flange removably attachable to an outer periphery of the chuck body;

a second mounting flange removably attachable to the heat transfer body and, an expansion joint comprising a deformable annular section connected between the mounting flanges, the expansion assembly accommodating differential thermal expansion of the chuck body and the heat transfer body.

22. The expansion assembly of claim 21, wherein the deformable annular section is connected to one of the mounting flanges by a curved section and to the other one of the mounting flanges by a brazed or welded joint.

23. The expansion assembly of claim 21, further comprising a clamping arrangement attached to the first mounting flange in a manner adapted to clamp the first mounting flange to the chuck body.

24. The expansion assembly of claim 23, wherein the clamping arrangement and first mounting flange of the expansion assembly are adapted to compress a metal C-ring seal between an outer periphery of the chuck body and said first mounting flange.

25. An expansion assembly for an electrostatic chuck comprising:

a first annular mounting flange removably attachable to a chuck body;

a second annular mounting flange; and, an expansion joint comprising a deformable annular section connecting the first and second mounting flanges.

26. The expansion assembly of claim 25, wherein the first annular mounting flange cooperates with a clamping arrangement adapted to clamp a chuck body to the first mounting flange.

27. The expansion assembly of claim 25, wherein the deformable annular section is connected to one of the mounting flanges by a curved section.

28. The expansion assembly of claim 25, wherein the deformable annular section is connected to one of the mounting flanges by a brazed or welded joint.

29. The expansion assembly of claim 25, wherein one of the first and second mounting flanges and the deformable annular section are made from a single piece of material.

* * * * *